United States Patent [19]

Fuchs et al.

[11] Patent Number: 5,311,400
[45] Date of Patent: May 10, 1994

[54] LOW PROFILE HEADER ASSEMBLY FOR AN ENCAPSULATED INSTRUMENT

[75] Inventors: Charles R. Fuchs, Wayne; Gerald J. Gorman, Pompton Lakes; Peter Lindsay, Hardyston Township, Sussex County, all of N.J.

[73] Assignee: GEC-Marconi Electronic Systems Corp., Wayne, N.J.

[21] Appl. No.: 78,554

[22] Filed: Jun. 16, 1993

[51] Int. Cl.$^5$ .............................................. H05K 1/14
[52] U.S. Cl. ..................................... 361/736; 361/730; 361/761; 361/807; 360/84; 360/109; 439/44; 174/261
[58] Field of Search ................ 361/730, 736, 748, 752, 361/761, 785, 791, 792, 796, 807, 813, 823; 360/84, 104–108; 439/75, 74, 44, 45; 174/17 R, 52.1, 52.4, 255, 261

[56] References Cited

U.S. PATENT DOCUMENTS

| | | | |
|---|---|---|---|
| 4,095,206 | 6/1978 | Hishiki | 336/96 |
| 4,621,529 | 11/1986 | Pittman | 73/504 |
| 4,835,645 | 5/1989 | Ohji et al. | 360/108 |
| 5,010,432 | 4/1991 | Fukushima et al. | 360/108 |

Primary Examiner—Leo P. Picard
Assistant Examiner—Young Whang
Attorney, Agent, or Firm—David L. Davis

[57] ABSTRACT

A low profile header assembly for an encapsulated instrument includes a plate member with a cavity which is on the side of the plate member external to the instrument. Terminal pins extend through the plate member both within the cavity and beyond its periphery. Hybrid amplifier circuitry is disposed within the cavity and electrically connected to the pins within the cavity. The cavity is hermetically sealed and the internal components of the instrument are electrically connected to the terminal pins within the instrument shell.

6 Claims, 4 Drawing Sheets

LOW PROFILE HEADER ASSEMBLY FOR AN ENCAPSULATED INSTRUMENT

BACKGROUND OF THE INVENTION

This invention relates to an instrument encapsulated within a shell and, more particularly, to a header assembly including a hybrid amplifier, the header assembly capping the instrument shell and having a low profile so as to reduce the overall length of the instrument.

U.S. Pat. No. 4,621,529 discloses an angular rate sensor assembly instrument which includes a gyroscopic element having a spin axis and a flexure hinge for resiliently mounting the gyroscopic element to a base. The sensor assembly further includes a torque sensing assembly which has a piezoelectric beam mounted in coaxial relation to the spin axis. A first beam restraining member mounts a first edge portion of the piezoelectric beam to the gyroscopic element and a second beam restraining member mounts an opposite edge portion of the piezoelectric beam to the base. The piezoelectric beam is adapted to generate an electrical signal proportional to the angular velocity of the sensor assembly about an axis perpendicular to the spin axis. The entire instrument is contained within an instrument shell which also holds a motor for driving the gyroscopic element and electronic circuitry, including a buffer amplifier, to provide an output signal derived from the piezoelectric beam electrical signal, which output signal is suitable for driving electronics to which the instrument is connected.

In recent years, there has been interest in reducing the overall length of such an encapsulated instrument. One limiting factor in the past has been the packaging of the buffer amplifier. Such an amplifier is typically of "hybrid" design, which is a mixture of discrete and printed circuitry within a hermetic enclosure. In the past, the hybrid amplifier was built up into a standard rectangular "flat-pack" case, with its own glassed in headers. This amplifier package, in turn, was bonded to the inside surface of a glass to metal seal header plate, the header plate forming an outside end of the hermetically sealed instrument. Electrical wires are soldered between the instrument's active components, the terminals of the flat-pack amplifier, and from these terminals to the inside of the instrument's glassed in terminal pins. Spacers are provided for the routing of wires around and between the flat-pack case and the header plate. This results in a redundant set of hermetic glass to metal sealed terminals, a redundant enclosure, and numerous flying wire leads that run between the amplifier and the header plate. With this arrangement, the sealed and tested amplifier is provided to the instrument assembly operation for installation to the header plate and subsequent wiring. The assembly of amplifiers, wiring and header plate is not tested again until top level instrument testing is performed.

It is therefore a primary object of the present invention to provide an arrangement which reduces the overall length of such an instrument.

It is a further object of the present invention to provide an arrangement which simplifies the internal wiring connections to the header plate.

It is another object of the present invention to provide a header assembly including a hybrid amplifier which can be tested as a complete module.

SUMMARY OF THE INVENTION

The foregoing, and additional, objects are attained in accordance with the principles of this invention in combination with an encapsulated instrument including a shell and components internal to the shell which require electrical connections external to the shell, by providing a header assembly for capping the shell which includes a plate member with a cavity on the side which is external to the shell. A first plurality of terminal pins extend through the plate member outside the cavity and a second plurality of terminal pins extend through the plate member within the cavity. Hybrid amplifier circuitry is disposed within the cavity and electrically connected to the second plurality of terminal pins. The cavity is hermetically sealed and the internal components of the instrument are electrically connected to the first and second pluralities of terminal pins within the shell.

In accordance with an aspect of this invention, the plate member is formed with a wall surrounding the cavity. The wall has a distal edge lying in a plane beyond the second plurality of terminal pins and the circuitry, and a cover plate is sealed to the distal edge of the wall.

In accordance with a further aspect of this invention, the first and second pluralities of terminal pins extend a substantially equal distance into the shell so that their distal ends lie substantially in a plane, thereby facilitating the wiring thereto.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
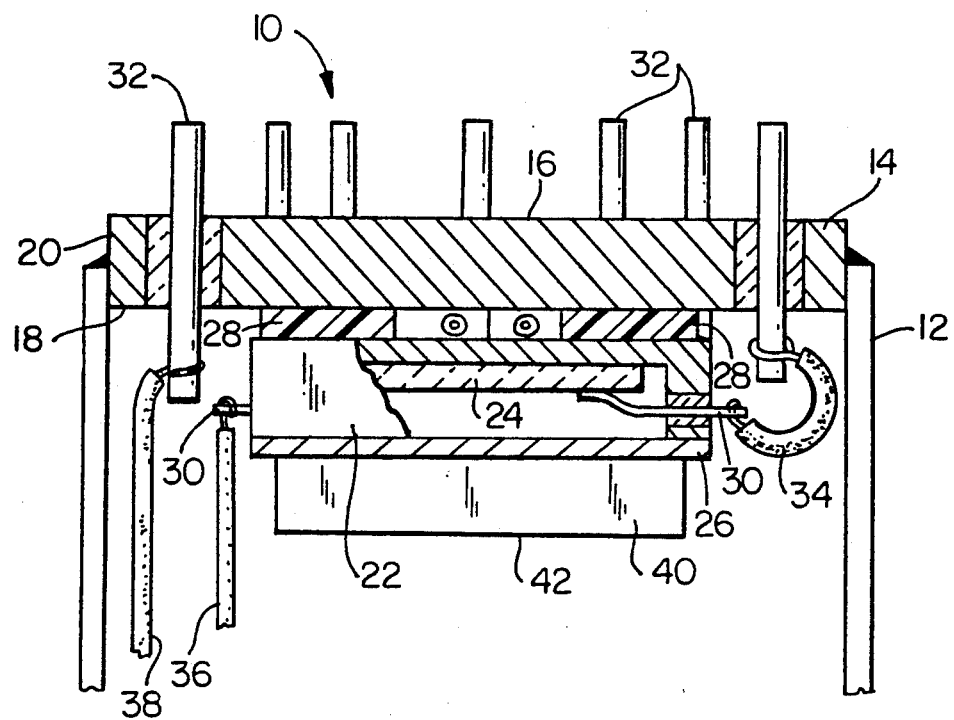
FIG. 1 is a partially cross-sectioned schematic representation of a prior art header assembly of the type replaced by this invention.

FIG. 1 illustrates a prior art header assembly, designated generally by the reference numeral 10, secured to an instrument shell 12 to provide an hermetic enclosure for the components of the instruments within the shell 12. The particular instrument depicted herein is illustratively the Multisensor angular rate sensor assembly manufactured by GEC-Marconi Electronic Systems Corp. of Wayne, N.J., the assignee of this invention.

The header assembly 10 includes a header plate 14 having an external planar surface 16, an internal planar surface 18, and a circumferential edge 20 which is sealed to the shell 12, as by welding, soldering, or the like.

The header assembly 10 also includes a rectangular flat-pack hybrid amplifier package 22 which contains a substrate assembly 24 having active components thereon. The amplifier package 22 is hermetically sealed by a soldered or welded cover 26 and is bonded to spacers 28 which are in turn bonded to internal surface 18 of the header plate 14. The amplifier package 22 includes a plurality of hermetically sealed electrical terminals 30 that attach internally to the substrate assembly 24. As is conventional, the terminals 30 exit the amplifier package 22 by means of glass to metal seals.

A plurality of terminal pins 32 extend through the header plate 14, by means of glass to metal seals, around the periphery of the hybrid amplifier package 22. Electrical wires 34 are utilized to interconnect the amplifier terminals 30 with the terminal pins 32. Electrical wires 36 are utilized to interconnect the amplifier terminals 30 with internal components of the instrument shell 12. Specifically, the wires 36 carry signals from the internal components to the amplifier within the package 22, which processes the signals to provide suitable signals to the outside world via the terminal pins 32. Further, electrical wires 38 interconnect the terminal pins 32 and internal components within the instrument shell 12 to provide, for example, power to the internal motor. There is also provided a spacer 40 bonded to the cover 26 which provides additional axial height in which to access wiring and solder joints. The present invention seeks to minimize the overall axial length of the header assembly 10, which extends from the external surface 16 of the header plate 14 to the internal surface 42 of the spacer 40. In addition, the present invention seeks to simplify the wiring pattern to the terminal pins 32 and the terminals 30 of the amplifier 22 so that such wiring may be automated.

Figure 2:
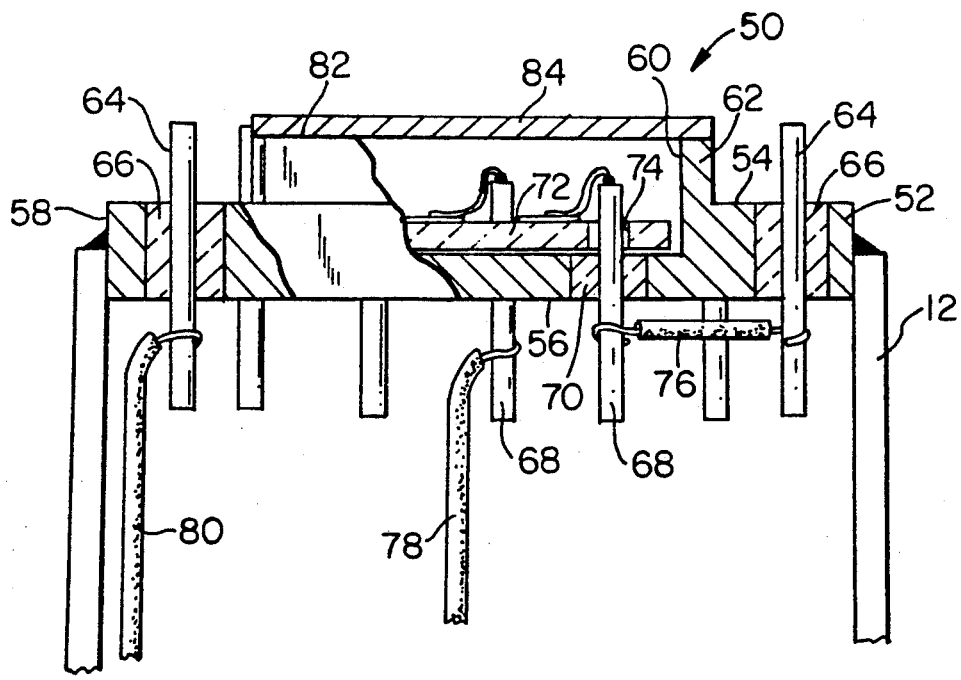
FIG. 2 is a partially cross-sectioned schematic representation of a header assembly constructed in accordance with the principles of this invention.
Figure 5:
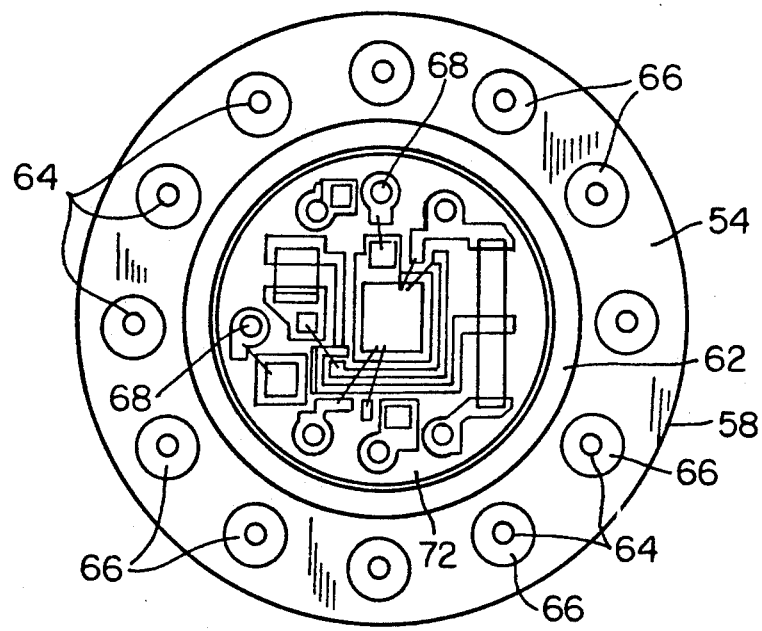
FIG. 5 is a plan view of the header assembly of FIG. 4.

FIG. 2 shows an improved header assembly, designated generally by the reference numeral 50, which is constructed in accordance with the principles of this invention and is sealed to the end of the instrument shell 12. The header assembly 50 includes a plate member 52 with a first side 54, a second side 56, and a circumferential edge 58. As with the prior header assembly 10 (FIG. 1) the circumferential edge 58 is sealed to the shell 12 by welding, soldering, or some other suitable means. The second side 56 of the plate member 52 is generally planar and faces toward the interior of the shell 12. The plate member 52 is formed with a cavity 60 open to the first side 54. The cavity 60 is defined by a wall 62 which surrounds the cavity 60. Preferably, as shown in FIG. 5, the plate member 52 is generally circular, as is the cavity 60 and the wall 62, all with a common center. A plurality of first terminal members 64, formed as conductive pins, extend through the plate member 52 from the first side 54 to the second side 56 beyond the wall 62. As is conventional, glass to metal seals 66 are utilized to maintain the integrity of the hermetic seal between the interior of the shell 12 and the exterior of the instrument. Similarly, a plurality of second terminal members 68, illustratively formed as conductive pins, are disposed in glass to metal seals 70 and extend through the plate member 52 within the cavity 60. As best viewed in FIG. 5, the first terminal members 64 are disposed along a first circle concentric with the wall 62 and the second terminal members 68 are disposed at defined coordinate locations, illustratively along a second circle concentric with the wall 62.

The amplifier circuitry is disposed on a substrate 72 bonded to the plate member 52 within the cavity 60. The substrate 72 is formed with a plurality of openings 74 for accepting therethrough the second terminal members 68. The amplifier circuitry of the substrate 72 is electrically connected to the terminal members 68, illustratively by a ball bonding process. Electrical connections between the terminal members 64 and the terminal members 68 are effected by means of the electrical wires 76 disposed in a single plane. Electrical connections between the amplifier circuitry and the internal components of the instrument are effected by means of the wires 78 connected to the terminal members 68. Electrical connections between the terminal members 64 and the internal components of the instrument 12 are effected by means of the wires 80. It is noted that all of the connections between the wires 76, 78 and 80 and the terminal members 64 and 68 are generally in a single plane. This is to be compared to the disorganized set of connections prone to producibility and reliability problems shown in the prior art of FIG. 1.

Figure 3:
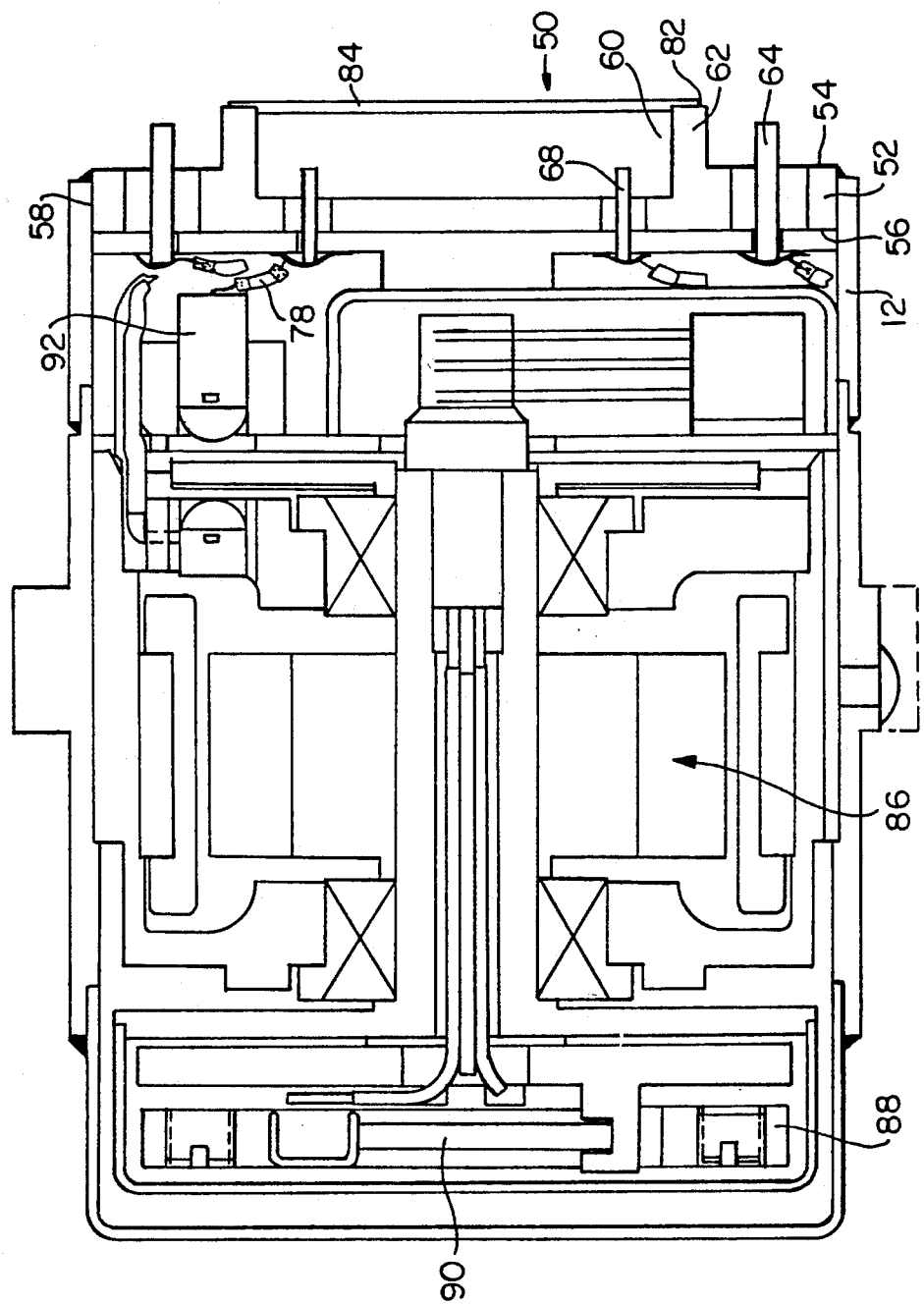
FIG. 3 is a cross-sectional view of an encapsulated instrument including a header assembly according to this invention.
Figure 4:
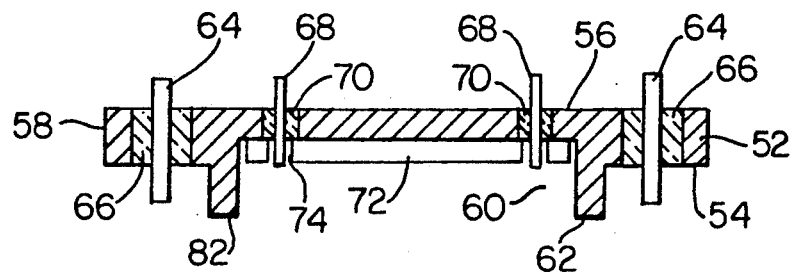
FIG. 4 is a cross-sectional view of an unsealed header assembly according to this invention.

As described, the cavity 60 is bounded by the wall 62. The wall 62 has a distal edge 82 which lies in a plane beyond the extent of the substrate 72, the circuit components thereon, and the terminal members 68 in the cavity 60. A cover plate 84 is sealed to the distal edge 82 of the wall 62, by welding, soldering or other appropriate procedure, so that the cavity 60, with the circuitry therein, is hermetically sealed. As shown in FIG. 3, the cover plate 84, which is the cover for the hybrid circuitry, actually forms part of the instrument cover.

FIG. 3 shows the header assembly 50 incorporated as part of an instrument of the type disclosed in the referenced patent. As shown, the instrument includes a motor 86, a gyroscopic element 88, a piezoelectric pick-off assembly 90, and a reference generator 92. All internal electrical connections to the header assembly 50 are made substantially in a single plane to the stubs of the terminal members 64 and 68 which extend into the shell 12 from the second side 56 of the header plate 52. Because all terminations to the terminal members 64 and 68 are generally within a plane, and since the locations of the terminal members 64 and 68 are easily defined (e.g., they lie at defined coordinate locations), connections of the wires 76, 78 and 80 to the terminal members 64 and 68 may be readily automated.

It is known that depending on the thickness of a pin extending through a plate, a certain minimum thickness of the plate is required to provide a hermetic glass to metal seal. The terminal members 68 may be thinner than the terminal members 64, since they are not exposed to the rigors of handling and the environment outside of the encapsulated instrument, so that the thickness of the plate member 52 in the region of the cavity 60 may be reduced as compared with the thickness of the plate member 52 outside the cavity 60.

A comparison of FIGS. 1 and 2 illustrates how the arrangement according to the present invention greatly reduces the axial length of the header assembly. Thus, the prior art arrangement requires the thickness of the header plate 14, the spacers 28, the hybrid amplifier package 22, the cover 26 and the spacer 40, most of which is beyond the inward extent of the terminal pins 32. In contrast, in the arrangement shown in FIG. 2, the height of the wall 62 and the thickness of the cover plate 84 is not much greater than the outward extent of the terminal members 64, a certain minimum length of these terminal members being required to accept soldering, with no inward extent beyond the stubs of the terminal members 64 and 68 being required.

Figure 6:
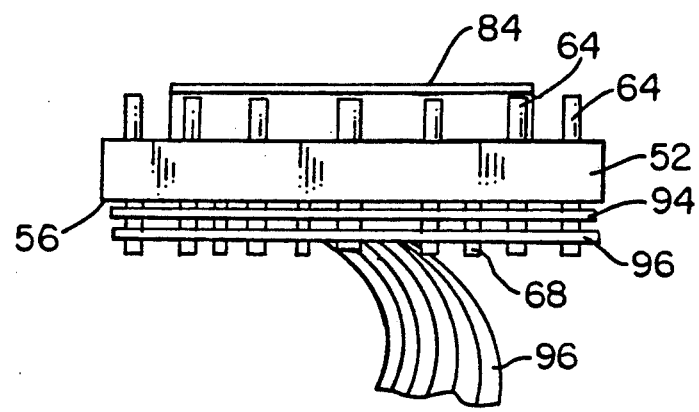
FIG. 6 schematically depicts a first alternative arrangement for making electrical connections to a header assembly constructed in accordance with this invention.
Figure 7:
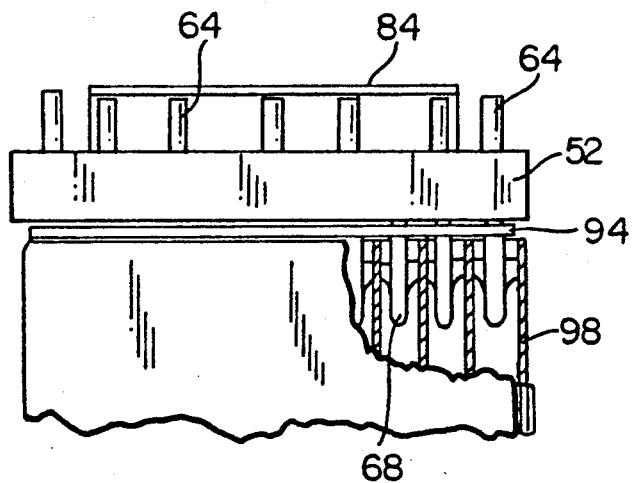
FIG. 7 schematically depicts a second alternative arrangement for making electrical connections to a header assembly constructed in accordance with this invention.

Although the internal connections to the terminal members 64 and 68 have been illustrated as being direct wire soldering connections, other alternative connection arrangements are possible. Thus, as shown in FIG. 6, the wires 76 may be replaced by the single printed circuit cable assembly 94, which is bonded flat to the second side 56 of the plate member 52. Similarly, the wires 78 and 80 may be replaced by the printed circuit cable assembly 96 which then extends to the internal components of the instrument. Another alternative is illustrated in FIG. 7 wherein the printed circuit cable assembly 94 replaces the wires 76 and the plug-in electrical connector 98 replaces the wires 78 and 80.

Thus, the improved header assembly according to this invention possesses a number of advantages. First, by using this improved header assembly, the total axial length of the instrument is reduced. Further, automated techniques may be utilized for connecting wires to the header assembly, since the terminal members thereof are in a single plane at defined coordinate locations. Also, the entire header assembly is manufacturable as a complete hybrid circuit assembly and may be tested as a complete functioning module, prior to its assembly as part of the instrument.

Accordingly, there has been disclosed an improved low profile header assembly-for an encapsulated instrument. While illustrative embodiments of the present invention have been disclosed herein, it is understood that various modifications and adaptations to the disclosed embodiments will be apparent to those of ordinary skill in the art and it is only intended that this invention be limited by the scope of the appended claims.

We claim:

1. In combination with an encapsulated instrument including a shell and components internal to said shell which require electrical connections external to said shell, a header assembly for capping said shell comprising:
   a plate member having first and second sides and a circumferential edge, said circumferential edge adapted for sealing to said shell with said first side external to said shell, said plate member being formed with a cavity open to said first side of said plate member, said second side of said plate member being generally planar;
   a plurality of first terminal members extending through said plate member from said first side to said second side and outside said cavity;
   a plurality of second terminal members extending through said plate member within said cavity;
   circuitry disposed within said cavity and electrically connected to said plurality of second terminal members within said cavity;
   sealing for sealing said cavity; and
   connecting means for providing electrical connections between said internal components of said instrument and said pluralities of first and second terminal members at said second side of said plate member.

2. The header assembly according to claim 1 wherein said plate member is formed with a wall surrounding said cavity, said wall having a distal edge lying in a plane beyond said plurality of second terminal members and said circuitry, and said sealing means includes a cover plate sealed to said distal edge of said wall.

3. The header assembly according to claim 1 wherein said pluralities of first and second terminal members are hermetically sealed to said plate member where they extend therethrough.

4. The header assembly according to claim 1 wherein each of said pluralities of first and second terminal members includes a conductive pin, said conductive pins extending substantially equally from said second side of said plate member so that their distal ends lie substantially in a plane parallel to said plate member second side.

5. The header assembly according to claim 4 wherein said connecting means comprises a printed circuit tape.

6. The header assembly according to claim 4 wherein said connecting means comprises a plug connector.

* * * * *

UNITED STATES PATENT AND TRADEMARK OFFICE
CERTIFICATE OF CORRECTION

PATENT NO. : 5,311,400
DATED : May 10, 1994
INVENTOR(S) : Charles R. Fuchs, et. al.

It is certified that error appears in the above-indentified patent and that said Letters Patent is hereby corrected as shown below:

Column 6, Claim 1, line 18, change "sealing" (first occurrence) to --sealing means--.

Signed and Sealed this

Thirtieth Day of August, 1994

Attest:

BRUCE LEHMAN

Attesting Officer

Commissioner of Patents and Trademarks